United States Patent [19]

van Driest et al.

[11] Patent Number: 5,003,562

[45] Date of Patent: Mar. 26, 1991

[54] DIGITAL PHASE LOCK LOOP DECODER

[75] Inventors: Hans van Driest, Bilthoven; Hendrik van Bokhorst, Nijkerk; Richard Kruithof, Voorschoten, all of Netherlands

[73] Assignee: NCR Corporation, Dayton, Ohio

[21] Appl. No.: 493,546

[22] Filed: Mar. 14, 1990

[30] Foreign Application Priority Data

Oct. 27, 1989 [GB] United Kingdom ............... 8924202

[51] Int. Cl.$^5$ .............................................. H03D 3/24
[52] U.S. Cl. ................................... 375/119; 370/108; 328/55
[58] Field of Search .................. 375/82, 87, 95, 118, 375/119, 120; 328/55, 63, 72, 155; 307/269, 480, 518; 331/1 R, 1 A, 25; 370/108

[56] References Cited

U.S. PATENT DOCUMENTS

| | | | |
|---|---|---|---|
| 4,584,695 | 4/1986 | Wong et al. | 375/81 |
| 4,627,080 | 12/1986 | Debus, Jr. | 375/119 |
| 4,661,965 | 4/1987 | Maru | 375/87 |
| 4,709,170 | 11/1987 | Li | 307/511 |
| 4,780,889 | 10/1988 | Ley et al. | 375/119 |
| 4,795,985 | 1/1989 | Gailbreath, Jr. | 328/155 |
| 4,841,167 | 6/1989 | Saegusa | 307/269 |
| 4,841,551 | 6/1989 | Avaneas | 375/119 |

FOREIGN PATENT DOCUMENTS

| | | | |
|---|---|---|---|
| 102598A | 3/1984 | European Pat. Off. | 375/119 |
| 0310088 | 9/1988 | European Pat. Off. | |

Primary Examiner—Douglas W. Olms
Assistant Examiner—Stephen Chin
Attorney, Agent, or Firm—Wilbert Hawk, Jr.; Albert L. Sessler, Jr.; Richard W. Lavin

[57] ABSTRACT

A digital phase lock loop decoder for use in decoding Manchester encoded data operates at an internal clock speed having a speed equal to the data rate of the encoded data. The decoder includes a first sampling circuit for providing signals based on the clock speed of the encoded data, a delay circuit for generating delayed clock signals relative to the clock speed of the encoded data, a second sampling circuit for sampling the encoded data based on the delayed clock signals, a feedback circuit for generating clock signals whose phase corresponds with the phase of the delayed clock signals and a storage for outputting decoded data signals corresponding to the encoded data utilizing the delayed clock signals.

12 Claims, 7 Drawing Sheets

| FINE | INTEGR | U/D | STEP |   |   |   |   |   |   |   |   |   | C-IN |
|------|--------|-----|---|---|---|---|---|---|---|---|---|---|------|
|      |        |     | 9 | 8 | 7 | 6 | 5 | 4 | 3 | 2 | 1 | 0 |      |
| 0 | 0 | U | 0 | 0 | 0 | 0 | L6 | L5 | L4 | L3 | L2 | L1 | 0 |
| 0 | 0 | D | 1 | 1 | 1 | 1 | -L6 | -L5 | -L4 | -L3 | -L2 | -L1 | 1 |
| 1 | 0 | U | 0 | 0 | 0 | 0 | 0 | L6 | L5 | L4 | L3 | L2 | 0 |
| 1 | 0 | D | 1 | 1 | 1 | 1 | 1 | -L6 | -L5 | -L4 | -L3 | -L2 | 1 |
| X | 1 | U | 0 | 0 | 0 | 0 | 0 | 0 | 0 | 0 | 0 | 1 | 0 |
| X | 1 | D | 1 | 1 | 1 | 1 | 1 | 1 | 1 | 1 | 1 | 0 | 1 |

| Q3 | Q2 | Q1 | | |
|----|----|----|---|---|
| 0 | 0 | 0 | —— | NO TRANSITIONS DETECTED |
| 0 | 0 | 1 | _⌐ | TRAILING RISING EDGE DETECTED |
| 0 | 1 | 0 | _⊓_ | TWO TRANSITIONS DETECTED |
| 0 | 1 | 1 | _⌐ | LEADING RISING EDGE DETECTED |
| 1 | 0 | 0 | ⌐_ | LEADING FALLING EDGE DETECTED |
| 1 | 0 | 1 | ⌐_⌐ | TWO TRANSITIONS DETECTED |
| 1 | 1 | 0 | ⌐_ | TRAILING FALLING EDGE DETECTED |
| 1 | 1 | 1 | —— | NO TRANSITIONS DETECTED |

DIGITAL PHASE LOCK LOOP DECODER

CROSS REFERENCE TO RELATED APPLICATION

Delay Measuring Circuit, patent application No. 07/493,593 filed on even date herewith, invented by H. van Driest, H. van Bokhorst and R. Kruithof.

BACKGROUND OF THE INVENTION

This invention relates to digital phase lock loop decoders and more particularly to the decoding of Manchester coded data. In Manchester coded data a signal transition is present at each mid-cell location, the direction of the transition representing the value of the encoded binary bit.

A digital phase lock loop decoder for decoding Manchester coded data is known from U.S. Pat. No. 4,584,695. This known decoder employs a multiphase driver clock circuit which provides clock signals which are phase-offset from one another. One clock output signal is used as the driver clock to provide a sample clock signal at four times the data rate or, in a fast clock mode, at eight times the data rate to determine whether the PLL reference clock is leading or lagging with respect to the received data signal. Thus, the known decoder has the disadvantage of needing relatively high rate clock signals, thereby rendering unsuitable the utilization of relatively lower speed, low cost implementation technologies, such as CMOS.

SUMMARY OF THE INVENTION

There is provided a digital phase lock loop decoder for decoding input data signals occurring at a predetermined nominal rate, characterized by clock signal supply means adapted to supply a first clock signal at said predetermined nominal rate, first delay line means adapted to delay said clock signal by a controllable delay time to provide a second clock signal, second delay line means adapted to receive said second clock signal and to provide a plurality of delayed clock signals having respective phased delay times relative to said second clock signals, sampling means responsive to said delayed clock signals and to said input data signals and adapted to provide a plurality of signal samples of said input data signals, phase compare logic means responsive to said second clock signal and to said plurality of signal samples and adapted to provide counter control signals adapted to control the operation of a counter means, feedback means coupled between an output of said counter means and said first delay line means and adapted to control said controllable delay time, thereby controlling the phase of said second clock signal to correspond with the phase of a selected one of said plurality of delayed clock signals, and data output means coupled to said sampling means and adapted to provide decoded output data signals corresponding to said input data signals.

It is thus an object of the present invention to provide a digital phase lock loop decoder in which the aforementioned disadvantage of needing relatively high rate clock signals is alleviated.

BRIEF DESCRIPTION OF THE DRAWINGS

Additional advantages and meritorious features of the present invention will be apparent from the following detailed description and appended claims when read in conjunction with the drawings wherein like numerals identify corresponding elements.

DESCRIPTION OF THE PREFERRED EMBODIMENT

Figure 1:
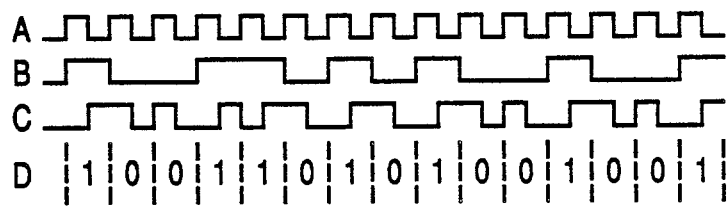
FIG. 1 shows waveform diagrams illustrative of Manchester encoded data.

Referring now to FIG. 1, the nature of a Manchester coded data signal will be described. Waveform A shown in FIG. 1 shows a periodic clock signal; waveform B shows a NRZ (nonreturn to zero) data signal, waveform C shows a corresponding Manchester coded data signal and line D shows the values of the data bits. It will be appreciated that the Manchester coded data signal C can be generated by the modulo-2 (exclusive-or) addition of the NRZ data signal B and the clock signal A. A Manchester coded signal consists of bit cells having a period equal to the data rate, the middle of each bit cell containing a transition which indicates the value of the data bit. Thus, a rising transition represents a "1" bit and a falling transition represents a "0" bit. Intermediate bit transitions between two bit cells occur only when two consecutive data bits are equal.

Figure 2:
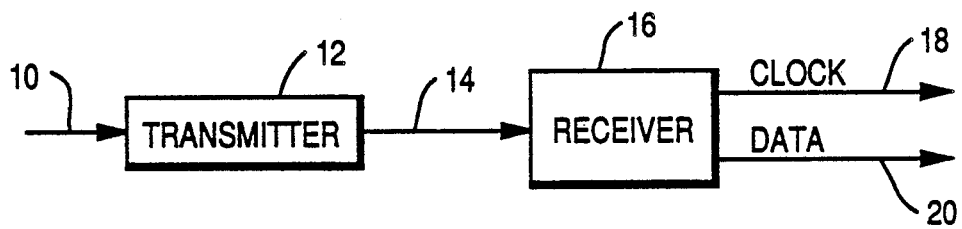
FIG. 2 is a block diagram of a data transmission system.

Referring now to FIG. 2, there is shown a data transmission system in which input data on a line 10 is applied to a transmitter 12 which converts the data to a Manchester coded signal for transmission over a transmission channel 14 to a receiver 16. The receiver 16 decodes the received Manchester coded signal to provide an output clock signal on a line 18 and an output data signal on a line 20.

In the preferred embodiment the transmitter 12 utilizes a system clock signal (FIG. 1-A), which is at a 10 MHz frequency, such that bit cells occur at 100 ns intervals. However, noise and distortion introduced on the transmission channel 14 will cause signal degradation, resulting in jitter on the mid-bit and intermediate bit transitions shown in FIG. 1-C. Clearly, the maximum allowable jitter is from +25 ns to −25 ns (50 ns peak to peak), since if the jitter amplitude exceeds 25 ns it will no longer be possible to distinguish mid-bit transitions from intermediate bit transitions.

In the preferred embodiment, the data is transmitted in the form of messages consisting of 62 bits of preamble, a two bit start of frame flag signal and a data field with a length of from 46 to 1500 data bytes. The 62 bit preamble is an alternating 1010 pattern which, when coded in Manchester code, does not contain any intermediate bit transitions.

Figure 3A:
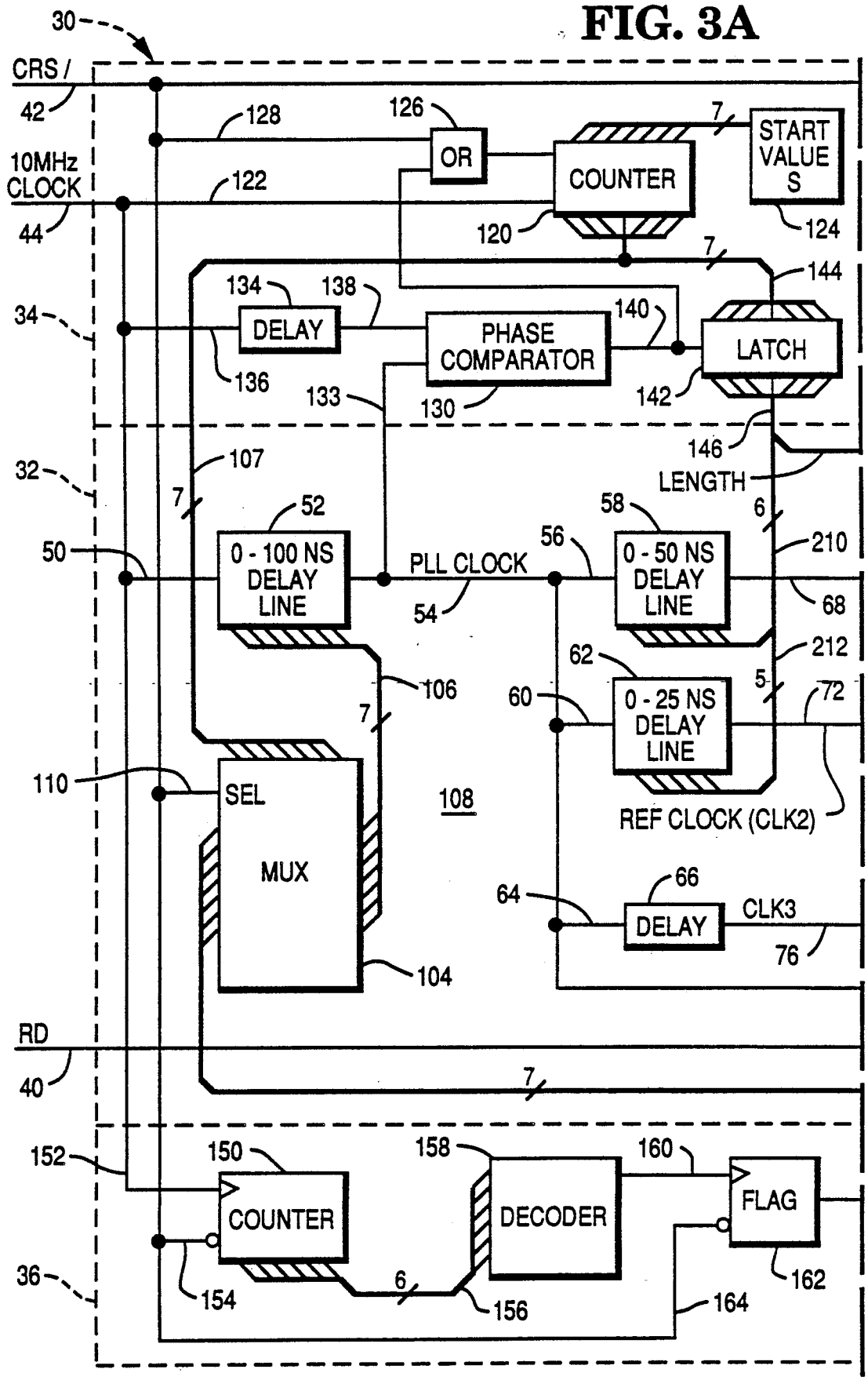
FIGS. 3A and 3B form a block diagram of a digital phase lock loop decoder according to the invention, for decoding Manchester encoded data.
Figure 3B:
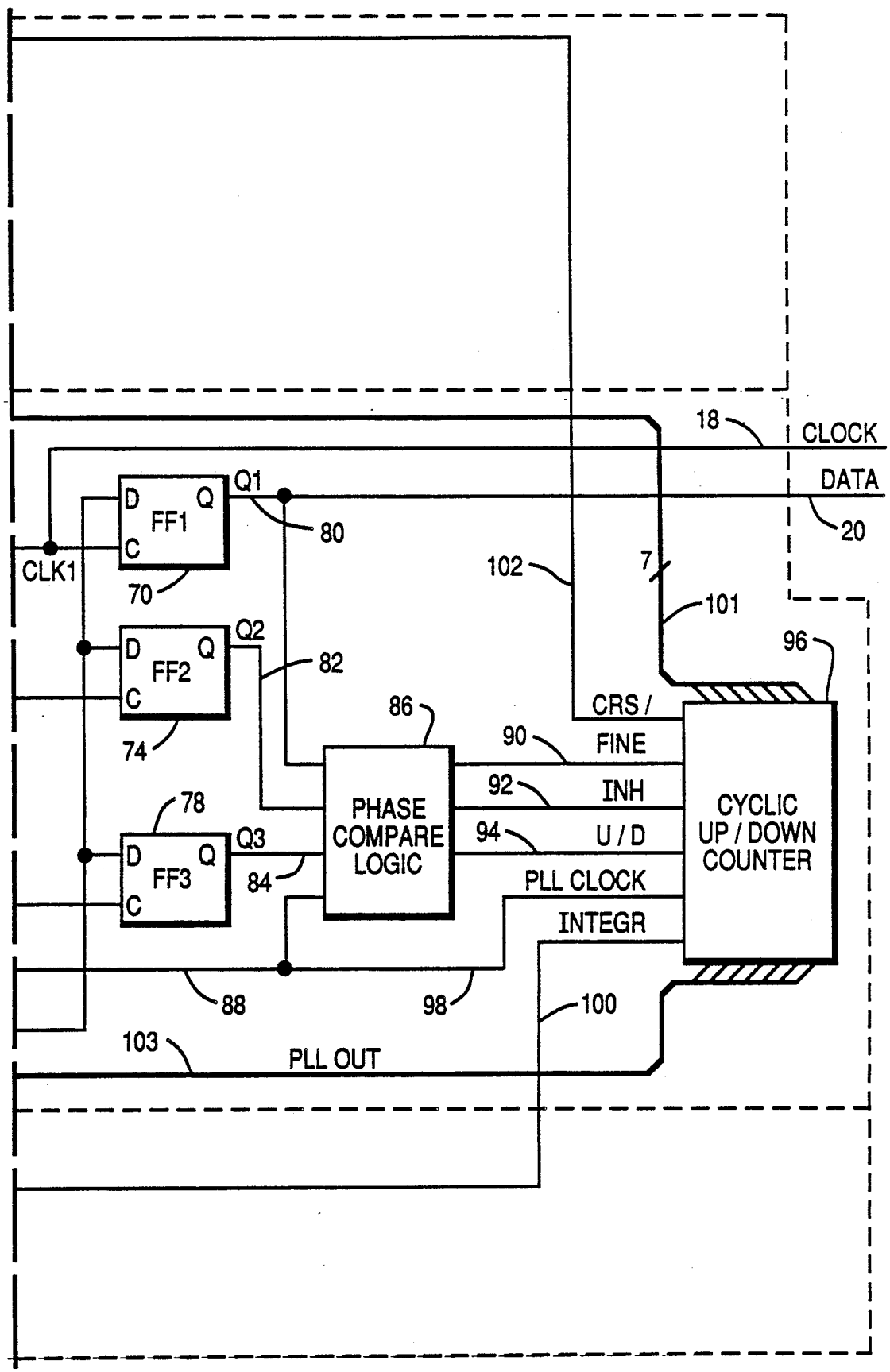

Referring now to FIGS. 3A and 3B, there is shown a Manchester decoder 30 forming a portion of the receiver 16 (FIG. 2). The decoder 30 includes: a data/clock recovery section 32, which utilizes a digital PLL (phase lock loop) and a plurality of delay lines; a delay correction section 34 which controls an initial setting for the delay lines, as will be explained hereafter; and a preamble timer section 36 which times a training period corresponding to the first 48 bits of the 62 bit preamble portion of a received message.

The decoder 30 receives the received data signal RD over a line 40, a carrier sense signal (CRS/) over a line 42 which becomes active when energy is detected on the transmission channel 14 (FIG. 2) at the start of message reception, and a locally generated 10 MHz clock signal over a line 44.

The data/clock recovery section 32 will first be described. The 10 MHz clock input line 44 is connected over a line 50 to a tapped delay line unit 52 which has a selectable delay up to a maximum delay of 100 ns. The construction of the delay line unit 52 will be described hereinafter with reference to FIG. 4. The output of the delay line unit 52, on an output line 54, is a phase lock loop clock signal, referred to as the PLL CLOCK. By selecting an appropriate tap of the delay line unit 52, the phase of the PLL clock signal is adjustable from 0 degrees to 360 degrees, corresponding to 0 ns up to 100 ns delay.

The line 54 is connected via a line 56 to the input of a delay line unit 58, via a line 60 to the input of a delay unit 62, and via a line 64 to the input of a delay circuit 66. The delay line units 58, 62 include tapped delay lines having selectable delays of up to 50 ns and up to 25 ns, respectively, and are of similar construction to the delay line unit 52, which is to be described hereinafter. The output of the delay line unit 58 is connected to a line 68, which is coupled to the clock output line 18 (FIG. 3B) and which is also coupled to the clock input of flip-flop 70. The output of the delay line unit 62 is connected to a line 72 which is connected to the clock input of a flip-flop 74. The output of the delay device 66 is connected via a line 76 to the clock input of a flip-flop 78. The output signals on the lines 68, 72 and 76 are referred to as CLK1, CLK2 or REF CLOCK, and CLK3, respectively. The data inputs of the flip-flops 70, 74 and 78 are all connected to the RD signal input 40 which carries the received Manchester coded data and the flop-flops 70, 74 and 78 are triggered on the rising edge of the applied clock signals CLK1, CLK2 and CLK3, respectively. The output signals of the flip-flops 70, 74 and 78, on output lines 80, 82 and 84 respectively, are referred to as samples Q1, Q2 and Q3, respectively. The output line 80 of the flip-flop 70 is coupled to the output data line 20.

The output lines 80, 82 and 84 of the flip-flops 70, 74 and 78 are connected to a phase compare logic circuit 86, to be described hereafter, which also receives as an input the PLL CLOCK signal via a line 88 connected to the line 54.

The phase compare logic circuit 86 (FIG. 3B) has three output lines 90, 92 and 94, which provide control signals FINE, INH AND U/D, respectively for a cyclic up/down counter circuit 96, which also receives the PLL CLOCK signal via a line 98 coupled to the line 88, and an enabling signal INTEGR on a line 100 which is the output line of the preamble timer section 36. A signal LENGTH having a predetermined value is also provided to the counter circuit 96, via a line 101 which is an output of the delay correction section 34, and the carrier sense signal CRS/ is provided to the counter circuit 96 via line 102.

The 7-bit wide output count signal of the counter circuit 96 is fed back via a line 103 to one input of a multiplexer 104, the output of which is connected over a 7-bit wide line 106 to the delay line unit 52. The multiplexer 104 also receives a further 7-bit wide input, via a line 107, from the delay correction section 34, and a select control input, via a line 110, which is connected to the line 42 on which the carrier sense signal CRS/ is provided. It will be appreciated that the data/clock recovery section 32 includes a digital phase lock loop (PLL), indicated generally by the reference 108.

The delay correction section 34 will now be described. The delay correction section 34 includes a counter 120 (FIG. 3A) which counts the 10 MHz clock signal supplied via a line 122 connected to the line 44. The counter 120 can be reset to a start value S, which is supplied from a register 124, or may be hardwired into the counter logic. The counter 120 is loaded with the start value S under the control of a LOAD signal provided on the output of an OR gate 126 which receives as inputs the carrier sense signal CRS/, over a line 128 connected to the line 42, and a phase compare output signal from a phase comparator 130, over a line 132.

The phase comparator 130 receives as inputs the output signal of the delay line unit 52, via a line 133, and the delayed 10 MHz clock signal via a delay circuit 134 which has an input connected via a line 136 to the line 44 and an output connected via a line 138 to the phase comparator 130.

The output of the phase comparator 130 is also connected via a line 140 to a latch circuit 142 to effect the latching of the 7-bit wide output count signal of the counter 120 onto the latch circuit 142. The value latched into the latch circuit 142 is the value LENGTH, which value is then applied over a 7-bit wide line 146 as the output of the delay correction section 34.

The preamble timer section 36 will now be described. The preamble timer section 36 includes a counter 150 (FIG. 3A) having a count input connected via a line 152 to the line 44 to receive the 10 MHz clock signal, and a clear input connected via a line 154 to receive the inverted carrier sense signal CRS/. The counter 150 has a 6-bit output connected to a 6-bit wide output line 156 which is connected to a decoder 158. The output of the decoder 158 is connected via a line 160 to the set input of a flag circuit 162, the output of which provides the aforementioned INTEGR signal on the line 100. The flag circuit 162 also receives a clear signal over a line 164 connected to receive the inverted carrier sense signal CRS/ on the line 44.

Figure 4:
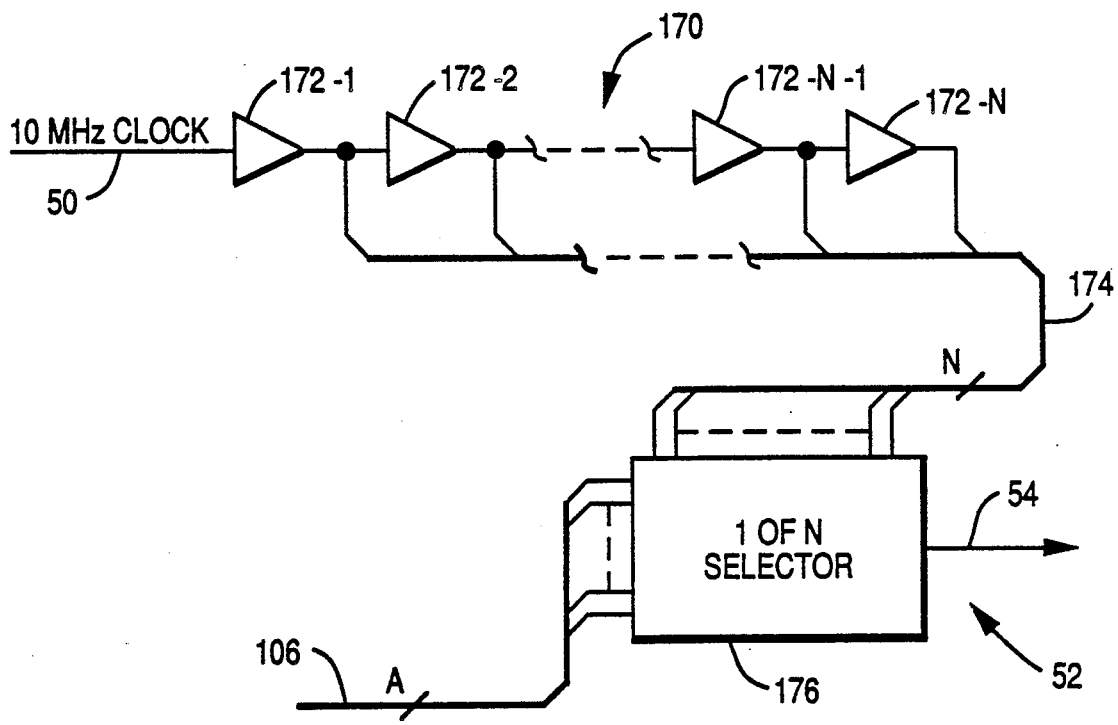
FIG. 4 is a block diagram of a delay line circuit, utilized in the decoder shown in FIGS. 3A and 3B.

Referring now to FIG. 4, a circuit for implementing the delay line unit 52 will now be described. The delay line unit 52 includes a delay line 170 including a plurality, N, of delay cells 172 referred to as individual delay cells 172-1, 172-2, ..., ..., 172-N-1, 172-N, each cell being of identical construction and formed for example, in known manner, as a buffer cell or an AND gate, which may be implemented as CMOS circuits where the decoder 30 is implemented in a CMOS technology integrated circuit chip. The 10 MHz clock signal on the line 50 is connected to the input of the first delay cell 172-1. The outputs of the delay cells 172 are connected to an N-bit wide line 174, which is connected to the input of a 1 of N selector switch 176, having an A-bit wide address supplied over the line 106. The output of the selector switch 176 is connected to the output line 54 of the delay line unit 52. It should be understood that a particular one of the N input lines is connected to the output line 54, in accordance with an address supplied on the line 106.

For the 0-100 ns delay line unit 52, the value of N is 128 and the value of A is 7. Thus a 7-bit address selects one of 182 delay line taps to provide a delayed output on the line 54. If the value of the A-bit address is X, then the output of delay cell number X is connected to the output of the selector switch 176.

The delay line units 58, 62 (FIG. 3A) are of similar construction to the delay line unit 52, and differ only in the values of the parameters N and A. Thus, for the 0-50 ns delay line unit 58, the value of N is 64, and the value of A is 6. For the 0-25 ns delay line unit 62, the value of N is 32 and the value of A is 5.

Figure 5:
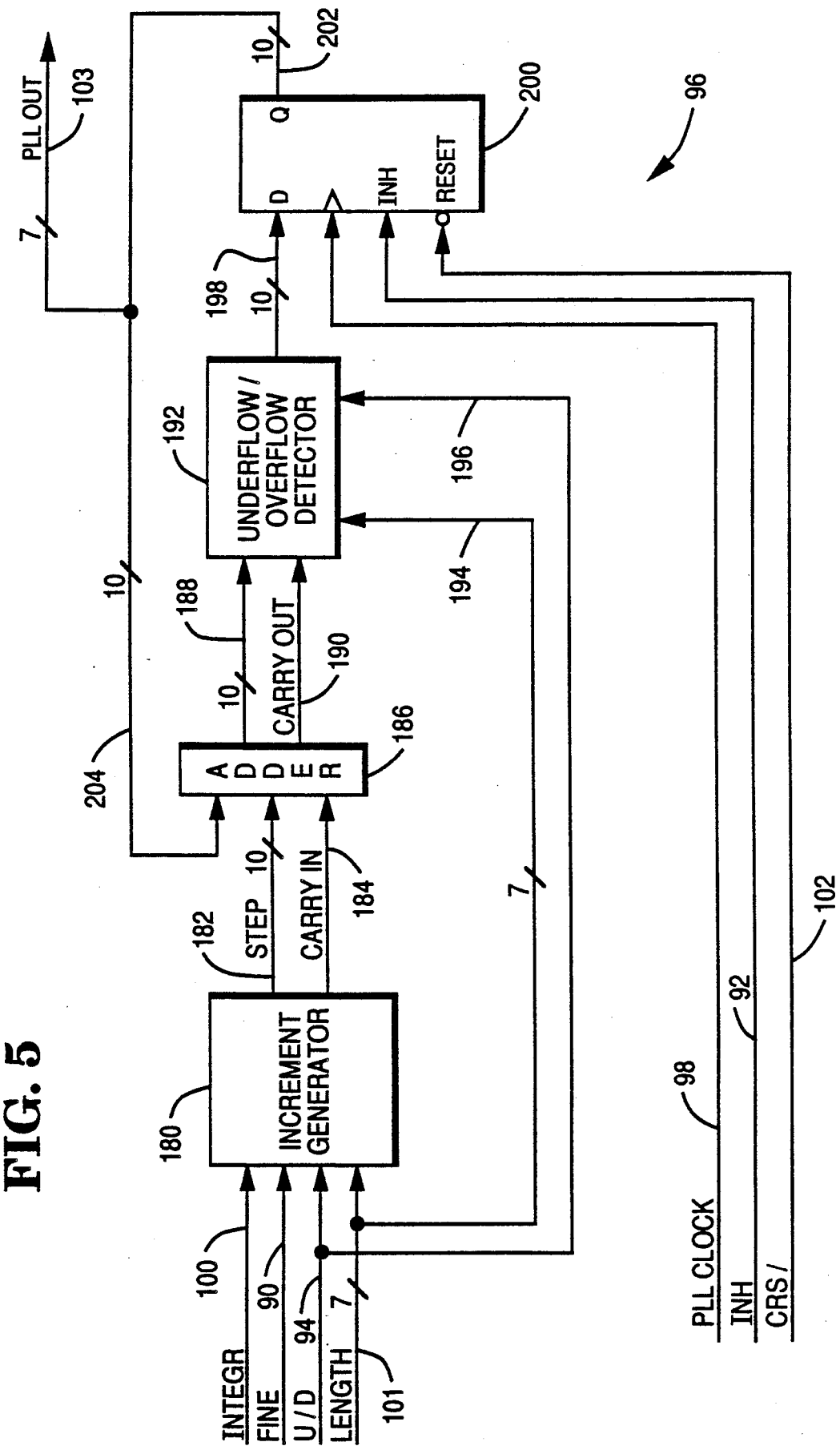
FIG. 5 is a block diagram of a cyclic up/down counter utilized in the circuit shown in FIGS. 3A and 3B.

Referring now to FIG. 5, there is shown a block diagram of the cyclic up/down counter circuit 96 (FIG. 3B). The counter circuit 96 includes an increment generator 180, which receives the control signals FINE, U/D, and INTEGR over the lines 90, 94 and 100, respectively, and the value of LENGTH over the 7-bit wide line 101. The increment generator generates a 10-bit wide STEP signal on a 10-bit wide output line 182, together with a CARRY IN (C-IN) signal on a line 184. The lines 182, 184 are connected to an adder circuit 186. The adder circuit 186 provides a 10-bit wide output signal on a 10-bit wide line 188, together with a CARRY OUT signal on a line 190. The lines 188, 190 are connected to an underflow/overflow detection circuit 192, which also receives as inputs the 7-bit value of LENGTH from the 7-bit line 101 via a 7-bit line 194, and the signal U/D from the line 94 via a line 196. The detection circuit 192 provides a 10-bit wide output signal on a 10-bit wide line 198 to the data input of a 10-bit flip-flop block 200, which also receives as a clocking input the PLL CLOCK signal over the line 98, the INH signal over the line 92 as an inhibit signal, and the inverted carrier sense signal CRS/ from the line 102 as a reset signal. A 10-bit wide output line 202 is connected to a feedback line 204 which is an input to the adder 186. The seven most significant bit lines of the output line 202 are connected to the 7-bit wide line 103, to provide the signal PLL OUT which is fed back to the multiplexer 104 (FIG. 3A).

With the above in mind, it will be appreciated that the cyclic up/down counter circuit 96 is implemented as an adder 186 with its outputs fed back to a set of its inputs. The adder 186 adds the output of the flip-flop block 200 to the 10-bit output value STEP of the increment generator 180. Thus, at every PLL CLOCK period, the value of STEP is added to or subtracted from the counter output. When the signal U/D on the line 94 indicates UP, STEP is added to the counter output value, and when the signal U/D indicates DOWN, STEP is subtracted from the counter output. The internal data width of the counter circuit 96 is 10 bits. However, the external interface utilizes only the seven most significant of these bits. A one step increase in the external 7-bit external output on the line 103 corresponds to a one tap increase in the delay of the delay line unit 52, (FIG. 3A), as will be more fully described hereinafter.

The result of the addition or subtraction in the adder 186 is checked by the underflow/overflow detection circuit 192. If the value is smaller than all zeros, and U/D is DOWN, then the underflow condition occurs and the underflow/overflow detection circuit 192 will replace the result by the value of LENGTH, applied over the line 194. If the value is larger than LENGTH and U/D is UP, then the overflow condition occurs and the underflow/overflow detection circuit 192 will replace the result by all zeros. Summarizing, the counter circuit 96 cycles between zero and LENGTH.

The INH input on the line 92 is activated when the phase compare logic circuit 86 (FIG. 3B) is unable to make a valid UP or DOWN decision, for example as a result of noise on the transmission channel 14 (FIG. 2). When the signal CRS/ is inactive, the counter circuit 96 is reset. Thus the PLL 108 (FIGS. 3A and 3B) will be inactive when no data is being received over the transmission channel 14.

It should be understood that the counter circuit 96 is able to count at three different speeds, determined by the size of STEP. There are two fast speeds for the PLL 108 during the training period, and one lowest possible speed, when the PLL 108 is locked after training. The value of STEP thus sets the step size to control the speed of the counter circuit 96. The speed of the counter circuit 96 during the training mode is independent of the absolute value of the delay cells in the delay line unit 52 (FIG. 3A). This is achieved by the increment generator 180 being effective during the training period by utilizing the value of LENGTH in the generation of STEP, as shown in Table 1. When the PLL 108 is locked, the counter circuit 96 will count at the lowest possible speed, which is independent of the value of LENGTH.

TABLE 1

| FINE | INTEGR | U/D | STEP |
|------|--------|-----|------|
| 0 | 0 | U | + LENGTH/16 |
| 0 | 0 | D | − LENGTH/16 |
| 1 | 0 | U | + LENGTH/32 |
| 1 | 0 | D | − LENGTH/32 |
| X | 1 | U | + ½ |
| X | 1 | D | − ½ |

Figures 6, 7:
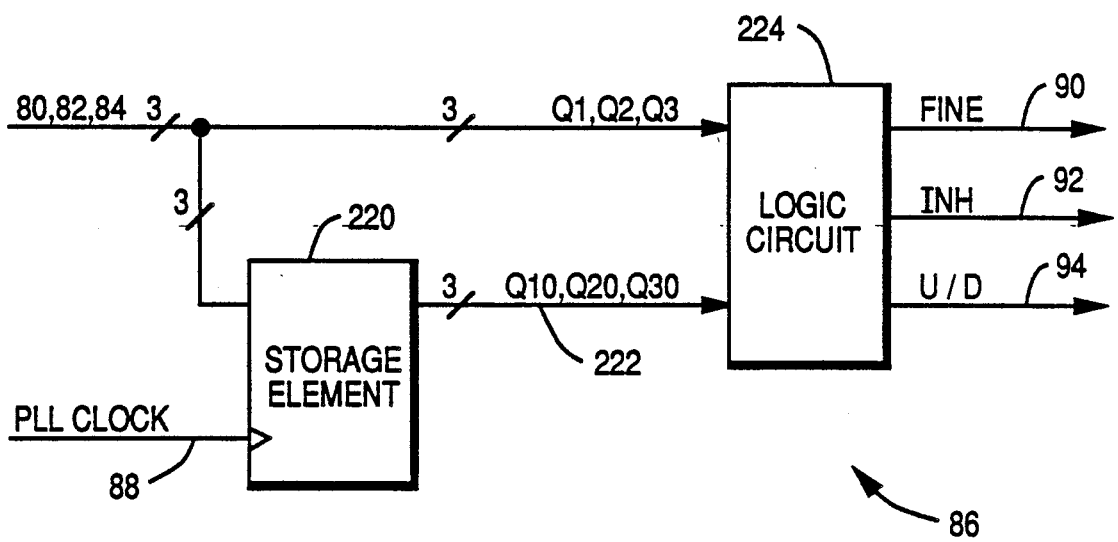
FIG. 6 is a table helpful in understanding the operation of the cyclic up/down counter.
FIG. 7 is a block diagram of the phase compare logic circuit shown in FIG. 3B.

Negative values (2's complements) of STEP are obtained by inverting all ten bits and activating the CARRY IN signal (C-IN) on the line 184. FIG. 6 shows the generation of C-IN and the individual bits of STEP. The symbol L0 represents the least significant bit of LENGTH, and L6 represents the most significant bit. The first two lines of FIG. 6 show a division of LENGTH by 16 and the next two lines show a division by 32. Thus the least significant bit L0 of LENGTH does not appear in FIG. 6.

It is convenient at the present juncture to describe generally the operation of the digital phase lock loop decoder 30. This operation falls into three phases. When no data is being received, the signal CRS/ is inactive and the delay correction section 34 is continuously active to compensate for variations in the actual delays of the delay line units 52, 58, and 62 (FIG. 3A). This has the advantage that the encoder 30 can be implemented in environments where large absolute delay variations occur, for example due to temperature or power supply variations, or device-to-device variations in integrated circuit chips.

When the reception of data is detected, the signal CRS/ becomes active and the training phase is entered. The training period continues for 48 bit times, as determined by the preamble timer section 36. During the training period three received data samples are utilized per bit time. These samples are taken using three clock signals CLK 1, CLK 2 and CLK 3 having the same clock rate as the data rate (10 MHz). Each of the three clock signals has a 90 degree phase difference compared to the previous clock. The 90 degree phase shifts are effected by delaying the sample clocks by means of the calibrated delay line units 52 and 58 and the fixed, compensating delay line unit 62. The three clock signals CLK 1, CLK2 and CLK 3 can be regarded as generating a window, corresponding to the sampled signals Q1, Q2, and Q3 provided by the flip-flips 70, 74 and 78 (FIG. 3B). During the training period for the PLL 108 not only samples of the current window are utilized, but also samples for the immediately preceding window, to assist in determining whether the phase of the PLL reference clock signal (PLL CLOCK) is leading or trailing compared to the phase of the received data signal RD. This has the advantage, as compared with utilizing only the current window, of minimizing erroneous decisions which might be taken in the presence of a large amount of jitter on the received data transitions.

Thus, it will be appreciated that the PLL decoder 30 (FIGS. 3A and 3B) trains by adjusting the phase of the PLL CLOCK signal until the phases of the REF CLK (CLK2) and the mid-bit transitions of the recorded data (RD) match. When the phases match, the PLL 108 is locked. The phase compare logic 86 (FIGS. 3B and 7) determines whether the phase of REF CLOCK is leading or trailing. If the REF CLOCK phase leads, then the counter circuit 96 counts down. If the REF CLOCK phase trails, then the counter circuit 96 counts up. In order to determine the proper count direction, the phase compare logic 86 utilizes the three consecutive samples Q1, Q2, Q3, of the signal RD. The sample Q2 represents the value of RD at the rising edge of REF CLOCK. The sample Q3 represents the value of the signal RD occurring 25 ns before the rising edge of REF CLOCK, and the sample Q1 equals the value of the signal RD occurring 25 ns after the rising edge of REF CLOCK. The phase compare logic circuit 86 ignores transitions of the signal RD that do not occur within the window Q1–Q3. Under certain conditions, as will be explained hereinafter, the count direction is dependent on both the current samples Q1, Q2, Q3 and the immediately previous samples Q10, Q20, Q30.

During the third phase of operation, after the training period, the counter circuit 96 operates at its lowest, fixed rate, which is independent of the value of LENGTH.

The operation of the delay correction section 34 will now be described in more detail, with reference to FIG. 3A. The delay correction section 34 can provide compensation for delay line variations occurring as a result of power supply and temperature fluctuations, and of device-to-device variations such as occur in integrated circuits. As previously mentioned, the delay correction section 34 is operative when the signal CRS/ is inactive. Note first that the delay correction section 34 utilizes for delay correction the 0–100 ns delay line unit 52 which is located in the data/clock recovery section 32. This has the advantage of preventing errors which might result from small delay differences between corresponding cells in two delay lines, if separate delay lines were utilized in the delay correction section 34 and the data/clock recovery section 32. It should further be noted that the delay circuit 134 is provided to compensate for the intrinsic delay of the delay line unit 52. Thus the delay circuit 134 has a delay equal to the intrinsic delay of the selector switch 176 (FIG. 4) in the delay line unit 52.

The 10 MHz clock signal is applied from the line 44 (FIG. 3A) and via lines 152, 50 to the multitapped delay line 170 (FIG. 4) included in the delay line circuit unit 52. The output tap selected by the switch 176 has its signal provided on the output line 54 and hence via the line 133 to the phase comparator circuit 130, the other input 138 of which receives the delayed 10 MHz clock signal, delayed by the compensating delay circuit 134. The 10 MHz clock signal is also applied via the line 122 to the counter 120. The count output of the counter 120 is provided over the line 107 at this time via the multiplexer 104 and the line 106 to the address input of the switch 176 (FIG. 4) to select an associated one of the taps of the delay line 170 for connection over the lines 54, 133 to the phase comparator 130. As long as no phase match is detected, the counter 120 is incremented and a further phase comparison is effected. When the phase comparator 130 detects a phase match, the value LENGTH in the counter 120 is latched into the latch circuit 142 and the counter 120 is reset to the start value S which is loaded in response to a signal applied through the OR gate 126. Thus the latch circuit 142 always stores a value LENGTH which represents the number of delay cells 172 (FIG. 4) which provide a delay equal to the clock period of 100 ns, i.e. corresponding to a phase shift of 360 degrees. When the CRS/ signal becomes active, the current value of LENGTH stored in the latch circuit 142 is utilized for the data and clock recovery operation in the data/clock recovery section 32.

Thus, during the next phase of operation, which is the training period, the counter circuit 96 cycles between zero and the 7-bit value of LENGTH, corresponding to a PLL CLOCK phase shift of 360 degrees.

As previously mentioned the data/clock recovery section 32 has three possible phase adjustment speeds. The adjustment speed is related to the magnitude of the difference between the RD (received data) signal and the REF CLOCK signal. For a larger phase difference, a higher adjustment speed is utilized. Once the PLL 108 is locked and the phases of the REF CLOCK and the RD mid-bit transitions match, the center of the window defined by the samples Q1–Q3 is positioned on the mid-bit transitions. The window should capture every mid-bit transition and should prevent the PLL from locking onto intermediate bit transitions which may occur during data reception. The width of the window is determined by the object of achieving both these purposes. To prevent intermediate bit transitions from entering the window, the window should be as narrow as possible. To capture every mid-bit transition, the window should be wider than the maximum expected jitter on the mid-bit transitions. In the preferred embodiment, the optimal width is 50 ns. This width allows a jitter amplitude of up to 25 ns on both sides of the intermediate and mid-bit transitions, yet permits the window still to achieve its purposes. After the first 48 preamble bits as counted by the preamble timer section 36, the preamble timer section 36 signals the end of the training period, and the PLL 108 is locked, with the phase adjustment being made at the lowest speed.

It will now be appreciated that the window is created by delaying the clock signal PLL CLOCK on the line 54 by 50 ns and by 25 ns, utilizing the delay line circuits 58 and 62 (FIG. 3A). The delay values of the delay line units 58 and 62 are arranged to be independent of the absolute value of the delays of the delay cells constituting the delay lines. This is achieved as follows. The value of the signal LENGTH, stored in the latch circuit 142, corresponds to a 360 degree phase shift or a 100 ns delay. Thus, the value LENGTH/2 corresponds to a 50 ns delay, and this value, via the 6-bit wide line 210, is applied as a six-bit input signal to the delay line unit 58. The value LENGTH/4 corresponds to a 25 ns delay, and this value is applied via the 5-bit wide line 212 as a five-bit input signal to the delay line unit 62. It will be appreciated that the delay circuit 66 is provided to compensate for the intrinsic delay in the delay line units 58, 62, that is, the intrinsic delay of the switches, corresponding to the switch 176 (FIG. 40), which are provided in the delay line units 58 and 62. Thus the PLL CLOCK signal on the line 54 is delayed by the delay circuit 66 by this intrinsic delay, to provide the signal CLK 3. The PLL decoder 30 adjusts the phase of PLL CLOCK signal and the mid-bit phases of REF CLOCK signal and the mid-bit transitions of the RD signal match, the effect of the intrinsic switch delay being compensated as described above.

Referring briefly to FIG. 7, there is shown a block diagram of the phase compare logic circuit 86 (FIG. 3B), which includes a clocked storage element 220 having an 3-bit wide output line 222 connected to a logic circuit 224, which may be implemented as a state machine, and which receives the signals Q1, Q2, Q3 representing the current window samples from the lines 80, 82, 84. The storage element 220 applies the previous window samples Q10, Q20 and Q30 to the logic circuit 224 via the 3-bit wide line 222.

Figures 8, 11:
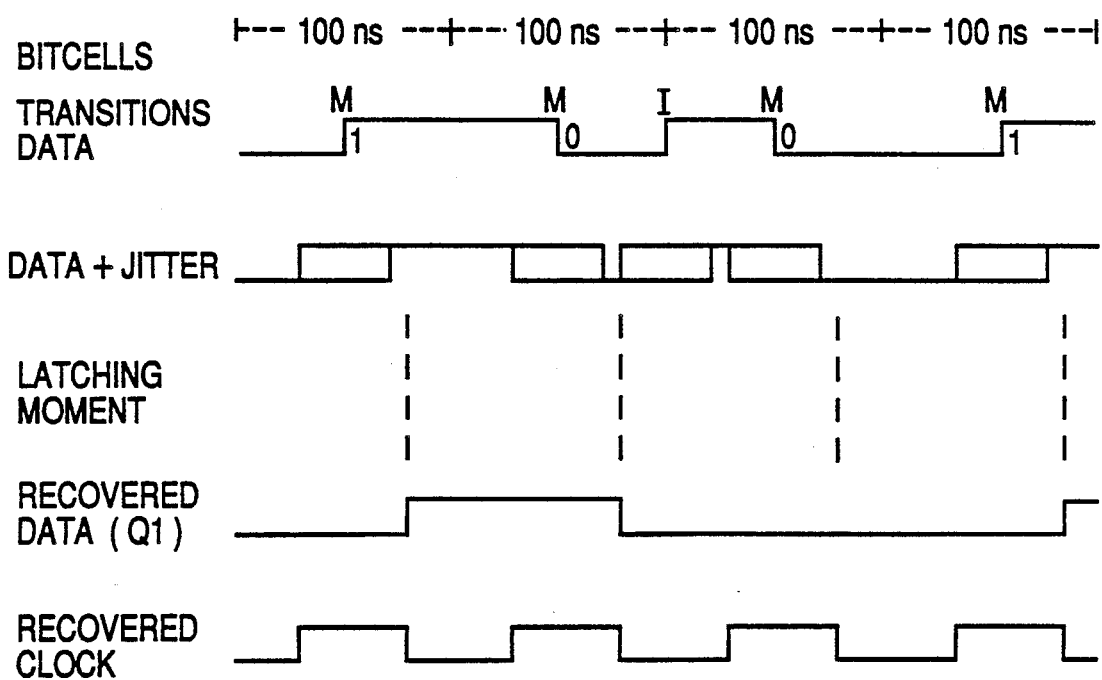
FIG. 8 is a table showing the interpretation of window information.
FIG. 11 shows waveforms illustrating the data recovery operation.

Referring now to FIG. 8, there is shown the interpretation of the window information. It will be appreciated that the two transitions in a window, corresponding to the samples O10 and 101, will occur only of noise causes a spurious level shift.

There are four stages of operation for the data/clock recovery section 32:

A. Adjust the PLL 108 until a mid-bit transition is captured by the window, using STEP=LENGTH/16.
B. Adjust the PLL 108 until mid-bit transitions are captured by two consecutive windows, using STEP=LENGTH/16.
C. Adjust the PLL 108 until the mean value of the jitter is positioned in the middle of the window using STEP=LENGTH/32.
D. Adjust the PLL 108 only to compensate for any frequency deviation of the received data. This stage is entered after the 48-bit preamble timer section 36 has timed out. The value of STEP=⅛.

During the first 48 preamble bits, when the PLL 108 is not yet in lock, not every window captures a transition. Therefore, the previous window information, referred to as Q10, Q20, Q30, and generated by the storage element 220 (FIG. 7), is also used. Note that, by using the samples of both the current and previous windows, the reliability of decisions in the presence of jitter on the RD signal transitions is significantly increased. During the first 48 preamble bits, corresponding to stages A, B and C, the logic circuit 224 implements Table 2. As is conventional, X represents a "don't care" state.

TABLE 2

| Q30 Q20 Q10 Q3 Q2 Q1 | |
|---|---|
| 000 000 or 111 111 | Illegal code. |

TABLE 2-continued

| Q30 Q20 Q10 Q3 Q2 Q1 | |
|---|---|
| 000 111 or 111 000 | Inhibit count. INH = 1, U/D = X Stage A Adjust PLL (always up) until transition is captured. INH = 0, U/D = up |
| 000 001 or 001 011 011 001 or 011 011 100 100 or 100 110 110 100 or 110 110 | Illegal codes. Equal polarity transitions detected in previous and current window. Inhibit count. INH = 1, U/D = X |
| 001 100 or 001 110 011 100 or 011 110 100 001 or 100 011 110 001 or 110 011 | Opposite result transitions detected in previous and current window. Use information from current window only. (See Table 3) |
| 000 001 or 000 011 000 100 or 000 110 111 001 or 111 011 111 100 or 111 110 001 000 or 011 000 100 000 or 110 000 001 111 or 011 111 100 111 or 110 111 | One transition in two consecutive windows detected. Use information from both windows. (See Table 4) |

Opposite stationary levels in the previous window and the current window (000 111 or 111 000) provide no up/down information. Therefore, the PLL 108 is adjusted in a fixed direction (UP). Normally these codes can only occur at the start of a message when the PLL is completely off phase (stage A). However, it is possible that during subsequent stages of operation (e.g. PLL 108 is adjusted DOWN) an incidental 000 111 or 111 000 occurs due to a jitter peak. In that case it would be undesirable to adjust in the UP direction. The PLL should not adjust. A state machine, which will be described later, with reference to FIG. 9, decides whether the 000 111 or 111 000 is incidental or not. In case the code is identified as incidental, inhibit count will be forced active (INH=1). In case of opposite transitions being detected in the previous and current window only the current window is utilized. In that case the current window is decoded according to Table 3.

TABLE 3

| Q3 | Q2 | Q1 | U/D | INH |
|---|---|---|---|---|
| 0 | 0 | 1 | U | 0 |
| 0 | 1 | 1 | D | 0 |
| 1 | 0 | 0 | D | 0 |
| 1 | 1 | 0 | U | 0 |

If one window detects a transition and the other does not, the information in both windows is utilized. There are 16 possible cases of one transition in two consecutive windows, and the direction of count (U or D) is determined by considering first a jitter-free signal, adding 20 ns jitter to the transitions, listing all possible 6-bit codes for one transition in two windows and, using the 6-bit codes and the signal including jitter, and determining ranges of possible windows. The position of the possible ranges relative to the transitions of the jitter-free signal determines the required direction of count. Table 4 shows a listing of all valid codes, and the resulting directions of count, for decoding in stages A, B and C.

TABLE 4

| Q30 | Q20 | Q10 | Q3 | Q2 | Q1 | U/D | INH |
|---|---|---|---|---|---|---|---|
| 0 | 0 | 0 | 0 | 0 | 0 | X | 1 |
| 0 | 0 | 0 | 0 | 0 | 1 | D | 0 |
| 0 | 0 | 0 | 0 | 1 | 1 | D | 0 |
| 0 | 0 | 0 | 1 | 0 | 0 | U | 0 |
| 0 | 0 | 0 | 1 | 1 | 0 | U | 0 |
| 0 | 0 | 0 | 1 | 1 | 1 | U | 0 |
| 0 | 0 | 1 | 0 | 0 | 0 | D | 0 |
| 0 | 0 | 1 | 0 | 0 | 1 | X | 1 |
| 0 | 0 | 1 | 0 | 1 | 1 | X | 1 |
| 0 | 0 | 1 | 1 | 0 | 0 | D | 0 |
| 0 | 0 | 1 | 1 | 1 | 0 | U | 0 |
| 0 | 0 | 1 | 1 | 1 | 1 | U | 0 |
| 0 | 1 | 1 | 0 | 0 | 0 | D | 0 |
| 0 | 1 | 1 | 0 | 0 | 1 | X | 1 |
| 0 | 1 | 1 | 0 | 1 | 1 | X | 1 |
| 0 | 1 | 1 | 1 | 0 | 0 | D | 0 |
| 0 | 1 | 1 | 1 | 1 | 0 | U | 0 |
| 0 | 1 | 1 | 1 | 1 | 1 | U | 0 |
| 1 | 0 | 0 | 0 | 0 | 0 | U | 0 |
| 1 | 0 | 0 | 0 | 0 | 1 | U | 0 |
| 1 | 0 | 0 | 0 | 1 | 1 | D | 0 |
| 1 | 0 | 0 | 1 | 0 | 0 | X | 1 |
| 1 | 0 | 0 | 1 | 1 | 0 | X | 1 |
| 1 | 0 | 0 | 1 | 1 | 1 | D | 0 |
| 1 | 1 | 0 | 0 | 0 | 0 | U | 0 |
| 1 | 1 | 0 | 0 | 0 | 1 | U | 0 |
| 1 | 1 | 0 | 0 | 1 | 1 | D | 0 |
| 1 | 1 | 0 | 1 | 0 | 0 | X | 1 |
| 1 | 1 | 0 | 1 | 1 | 0 | X | 1 |
| 1 | 1 | 0 | 1 | 1 | 1 | D | 0 |
| 1 | 1 | 1 | 0 | 0 | 0 | U | 0 |
| 1 | 1 | 1 | 0 | 0 | 1 | U | 0 |
| 1 | 1 | 1 | 0 | 1 | 1 | U | 0 |
| 1 | 1 | 1 | 1 | 0 | 0 | D | 0 |
| 1 | 1 | 1 | 1 | 1 | 0 | D | 0 |
| 1 | 1 | 1 | 1 | 1 | 1 | X | 1 |

In Table 4, it should be appreciated that cases of two transitions in a single window, which are illegal codes, are not shown, and are always decoded into U/D=X, INH=1.

Figure 9:
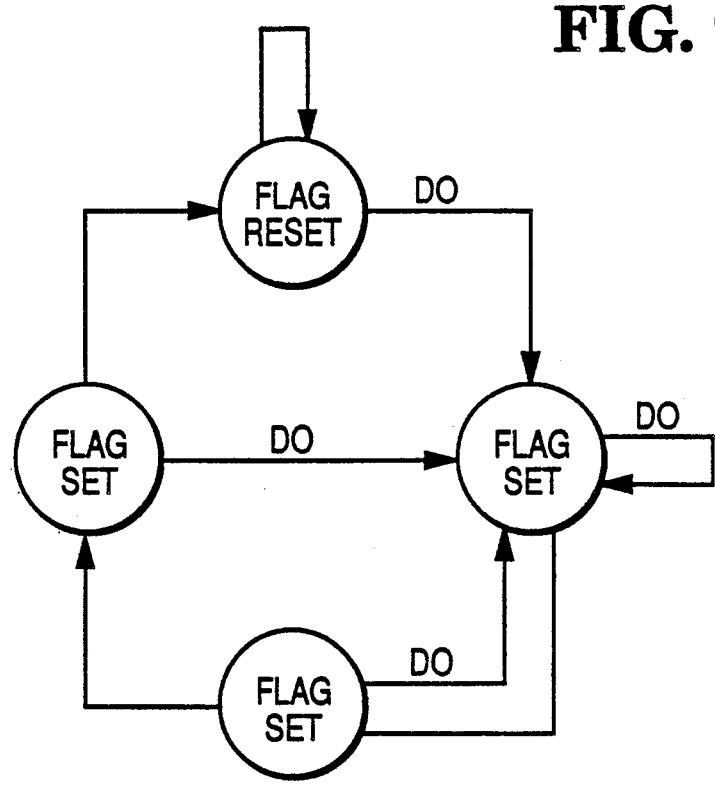
FIG. 9 is a state diagram for the FLAG signal.

Also, the decoding of the codes 000 111 and 111 000, which are shown in Table 4 as U/D=U and INH =0, is effected by a state machine having the state diagram shown in FIG. 9. The state machine is part of the logic circuit 224 (FIG. 7) included in the phase compare logic circuit 86 (FIG. 3A). The output of the state machine, which is the signal FLAG, indicates whether the code was incidental or not. If FLAG=1, then the code is incidental. The state machine is controlled by the Q1, Q2, Q3 output signal shown in FIG. 8. The signal FLAG is set by a non-inhibited DOWN (U/D=D and INH=0). It is reset by three consecutive DOWN signals or INH signals. In the state diagram of FIG. 9, D0 means U/D=D and INH=0. The state machine steps every PLL CLOCK signal. If the 000 111 or 111 000 code is incidental, i.e. FLAG=1, then INH is forced active. Otherwise, the INH signal is passed through.

After the first 48 preamble bits, the preamble timer section 36 provides an active signal INTEGR over line 100 (FIG. 3B) and stage D of the decoding operations is entered. During state D, decoding is performed according to Table 5.

TABLE 5

| Q3 | Q2 | Q1 | U/D | INH |
|---|---|---|---|---|
| 0 | 0 | 0 | X | 1 |
| 0 | 0 | 1 | U | 0 |
| 0 | 1 | 0 | X | 1 |
| 0 | 1 | 1 | D | 0 |
| 1 | 0 | 0 | D | 0 |
| 1 | 0 | 1 | X | 1 |
| 1 | 1 | 0 | U | 0 |
| 1 | 1 | 1 | X | 1 |

Figure 10:
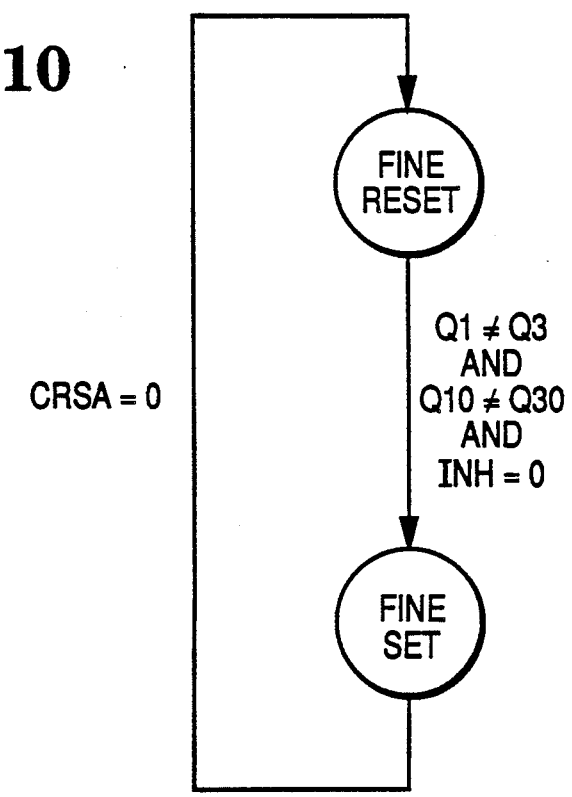
FIG. 10 is a state diagram for the FINE signal.

The signal FINE, on line 90 (FIGS. 3B and 5), controls the size of the incremental or decremental steps of the counter circuit 96. The signal FINE is also generated by a state machine included in the logic circuit 224 (FIG. 7). The state diagram of this state machine is shown in FIG. 10. The signal FINE is set if the previous and the current window both contain a valid transition. The signal FINE is reset between messages when CRS/ is inactive (CRS/=0).

The data receiving operation will now be described, with reference to FIG. 11. This takes place when the PLL 108 is locked. As previously mentioned, in Manchester code the value of a data bit is indicated by the polarity of the mid-bit transition. A rising mid-bit transition represents a one, a falling transition represents a zero. Thus, the second half of a bit cell has the same value as the Manchester encoded data bit. Data recovery is effected by latching the second half of a Manchester bit cell. The optimal latching moment is determined by the jitter extremes of the mid-bit transition and the following intermediate transition. In the worst case the mid-bit transition has a theoretical maximum jitter of $+25$ ns and is followed by an intermediate transition having a $-25$ ns jitter. Both transitions occur at the same moment in time. Should less than $+/-25$ ns jitter be allowed, e.g. $+/-24$ ns, then there is a 2 ns period during which the data is valid. The optimum data latch period, i.e. the middle of this 2 ns period, is 25 ns after the occurrence of the mid-bit transition ($\frac{3}{4}$ of a bit cell, (FIG. 11). The output of the delay line unit 58 (FIG. 3A) samples the RD (received data) signal 25 ns after the occurrences of the mid-bit transition, so Q1 equals the recovered data.

Thus, there has been described a digital phase lock loop decoder for decoding Manchester coded data which has the advantage of utilizing a clock signal that has a frequency equal to the data rate, thereby avoiding the need for high frequency sampling clock signal. This has the advantage that the decoder can be implemented in relatively low cost, reliable, low power technologies, such as CMOS.

We claim:

1. A digital phase lock loop decoder for decoding input data signals occurring at a predetermined nominal rate comprising:
   clock signal supply means adapted to supply a first clock signal at said predetermined nominal rate;
   first delay line means adapted to delay said first clock signal by a controllable delay time to provide a second clock signal;
   second delay line means adapted to receive said second clock signal and to provide a plurality of delayed clock signals having respective phased delay times relative to said second clock signal;
   sampling means responsive to said delayed clock signals and to said input data signals and adapted to provide a plurality of signal samples of said input data signals;
   counter means for counting said signal samples;
   phase compare logic means responsive to said second clock signal and to said plurality of signal samples and adapted to provide counter control signals adapted to control the operation of said counter means;

feedback means coupled between an output of said counter means and said first delay line means and adapted to control said controllable delay time, thereby controlling the phase of said second clock signal to correspond with the phase of a selected one of said plurality of delayed clock signals; and data output means coupled to said sampling means and adapted to provide decoded output data signals corresponding to said input data signals.

2. The digital phase lock loop decoder according to claim 1 also including delay correction means coupled to said first and second delay line means and adapted to compensate for variations in the delay times thereof.

3. The digital phase lock loop decoder according to claim 2 in which said first delay line means includes a first delay line having a plurality of individual delay cells, said decoder also including delay measuring means adapted to provide a measured value representing the number of said delay cells having a delay equal to the period of said first clock signal and further including storage means adapted to store said measured value.

4. The digital phase lock loop decoder of claim 3 in which said second delay line means includes second and third delay lines coupled to said storage means having controllable delay times determined in dependence on said measured value.

5. The digital phase lock loop decoder of claim 2, in which the decoder receives a control signal in addition to the input data signals and where the control signal is active when the decoder is not receiving input data signals, said control signal enabling said delay correction means for operation when active.

6. The digital phase lock loop decoder of claim 1, in which said phase compare logic means includes a storage element adapted to store an immediately preceding plurality of said signal samples, said decoder further including logic circuit means adapted to provide said counter control signals in dependence on the current plurality of said signal samples and said immediately preceding plurality of said signal samples.

7. The digital phase lock loop decoder of claim 6 in which said counter means includes a cyclic up/down counter.

8. The digital phase lock loop decoder of claim 3 in which said counter means includes a cyclic up/down counter and said storage means is coupled to said cyclic up/down counter whereby said cyclic up/down counter cycles between zero and said measured value.

9. The digital phase lock loop decoder of claim 8 in which said cyclic up/down counter includes increment generating means having inputs coupled to outputs of said phase compare logic means and adapted to generate a step size for incrementing or decrementing said counter, the value of said step size being dependent on one of said counter control signals.

10. The digital phase loop decoder according to claim 9 in which said storage means is coupled to said increment generating means whereby said step size is further dependent on said measured value.

11. The digital phase lock loop decoder of claim 1 further including preamble timer means adapted to provide a time-out signal after the lapse of a time corresponding to a preamble portion of said received data signals, said time-out signal being applied to said counter means.

12. The digital phase lock loop decoder according to claim 1 in which said input data signals are in Manchester coded form.

* * * * *